(12) United States Patent
Liu et al.

(10) Patent No.: US 8,878,420 B2
(45) Date of Patent: Nov. 4, 2014

(54) HAPTIC FEEDBACK APPARATUS

(75) Inventors: Lin Liu, Shenzhen (CN); Jie He, Shenzhen (CN)

(73) Assignees: AAC Acoustic Technologies (Shenzhen) Co., Ltd., Shenzhen (CN); American Audio Components Inc., La Verne, CA (US)

( * ) Notice: Subject to any disclaimer, the term of this patent is extended or adjusted under 35 U.S.C. 154(b) by 428 days.

(21) Appl. No.: 13/438,356

(22) Filed: Apr. 3, 2012

(65) Prior Publication Data

US 2012/0248935 A1    Oct. 4, 2012

(30) Foreign Application Priority Data

Apr. 4, 2011    (CN) .................. 2011 2 0096871 U

(51) Int. Cl.
*H01L 41/08*    (2006.01)
*G06F 3/01*    (2006.01)
*H01L 41/09*    (2006.01)

(52) U.S. Cl.
CPC ............ *H01L 41/0933* (2013.01); *G06F 3/016* (2013.01)
USPC .......................................... 310/328; 310/331

(58) Field of Classification Search
CPC ............................ G06F 3/016; H01L 41/0933
USPC ..................................................... 310/328, 331
See application file for complete search history.

(56) References Cited

U.S. PATENT DOCUMENTS

| | | | | |
|---|---|---|---|---|
| 6,933,658 | B2 * | 8/2005 | Takeuchi et al. | 310/328 |
| 6,969,942 | B2 * | 11/2005 | Takeshima et al. | 310/324 |
| 7,045,932 | B2 * | 5/2006 | Xu et al. | 310/323.17 |
| 7,872,397 | B2 * | 1/2011 | Clingman et al. | 310/328 |
| 8,325,024 | B2 * | 12/2012 | Dong et al. | 340/407.1 |
| 8,427,441 | B2 * | 4/2013 | Paleczny et al. | 345/173 |
| 8,569,937 | B1 * | 10/2013 | Kubena et al. | 310/366 |
| 2012/0326568 | A1 * | 12/2012 | Liu et al. | 310/348 |
| 2014/0070667 | A1 * | 3/2014 | Oh et al. | 310/326 |

FOREIGN PATENT DOCUMENTS

| | | | | |
|---|---|---|---|---|
| EP | | 2221708 A2 * | 8/2010 | |
| WO | WO 2008151863 A1 * | 12/2008 | | G06F 3/033 |
| WO | WO 2012161061 A1 * | 11/2012 | | |

* cited by examiner

*Primary Examiner* — J. San Martin
(74) *Attorney, Agent, or Firm* — Anova Law Group, PLLC

(57) ABSTRACT

Disclosed is an apparatus used in an electronic device for providing haptic feedback. The apparatus includes a main board defining a mounting surface, a vibration unit mounted on the mounting surface of the main board, the vibration unit being capable of vibrating along a direction parallel to the mounting surface. At least two screws are provided to fix the vibration unit on the main board, and a pair of stop block is provided to restricting the position of the vibration unit.

10 Claims, 2 Drawing Sheets

HAPTIC FEEDBACK APPARATUS

BACKGROUND OF THE INVENTION

1. Field of the Invention

The present invention generally relates to the art of piezoelectric vibrators, more particularly to a haptic feedback apparatus used in an electronic device for providing haptic feedbacks.

2. Description of Related Art

As disclosed in U.S. Pat. No. 7,535,454 B2, portable electronic devices, such as mobile phones, portable GPS navigations, laptop computers, generally have a number of buttons that allow a user to interface with the devices by inputting information. The capabilities of these devices are increasing while the size and weight are decreasing to enhance portability. For example, mobile phones, in addition to their traditional role as voice-communication devices, now include functions traditionally associated with other devices, such as electronic games, PDAs, and digital cameras.

To permit effective interaction with the handheld devices, the handheld devices typically provide visual and aural cues or feedback. In addition to conventional visual and aural feedback, some of these devices attempt to enhance the effectiveness of device feedback by providing tactile cues or feedback. Some devices utilize structural tactile methods. One such example is to provide raised surfaces on the input surface, e.g., a keypad, of the device. Such methods, however, are inherently static and thus cannot offer effective tactile feedback. Generally, a piezoelectric vibrator includes a diaphragm, and a pair of piezoelectric layers separately attached to two sides of the diaphragm. Excessive amplitude of the diaphragm will affect the performance of the piezoelectric vibrator.

Active methods of providing tactile feedback include incorporating a vibrator into the handheld electronic devices. Such a method of providing haptic cues, however, generally vibrates the entire device. Such method or apparatuses are disclosed in U.S. Pat. Nos. 7,535,454 B2, 7,148,875 B2, 6,853,965 B2, 6,429,846 B2, 6,405,158 B2.

DETAILED DESCRIPTION

Reference will now be made to describe an exemplary embodiment of the present disclosure in detail.

The present disclosure is presented for providing the user with intensive interaction experience. For example, if a user taps on a touch screen of a portable gaming, the user will get a tactile feedback, such as vibration, from the touch screen.

Figure 1:
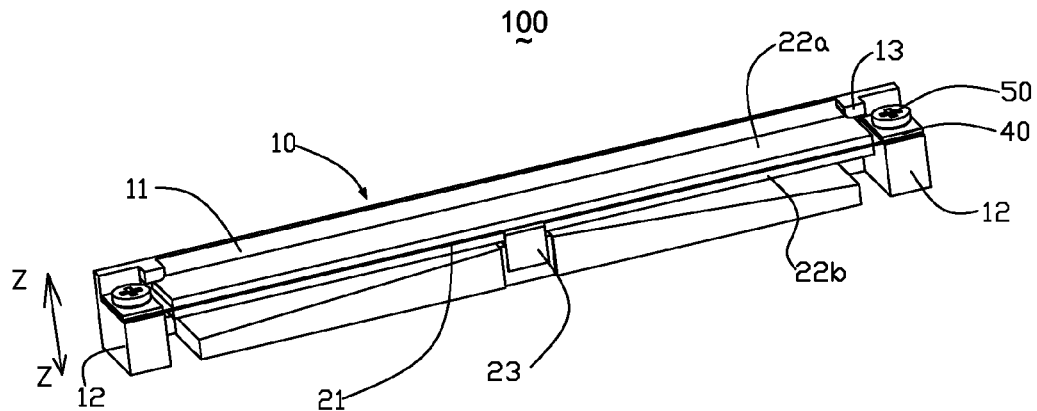
FIG. 1 is an isometric view of a haptic feedback apparatus in accordance with an exemplary embodiment of the present invention.
Figure 2:
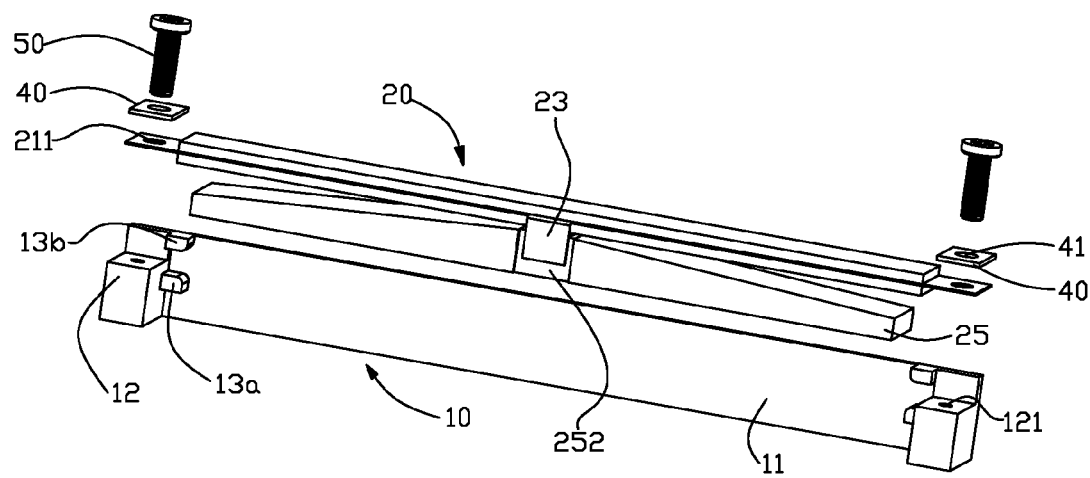
FIG. 2 is a partial exploded view of the haptic feedback apparatus in FIG. 1.
Figure 3:
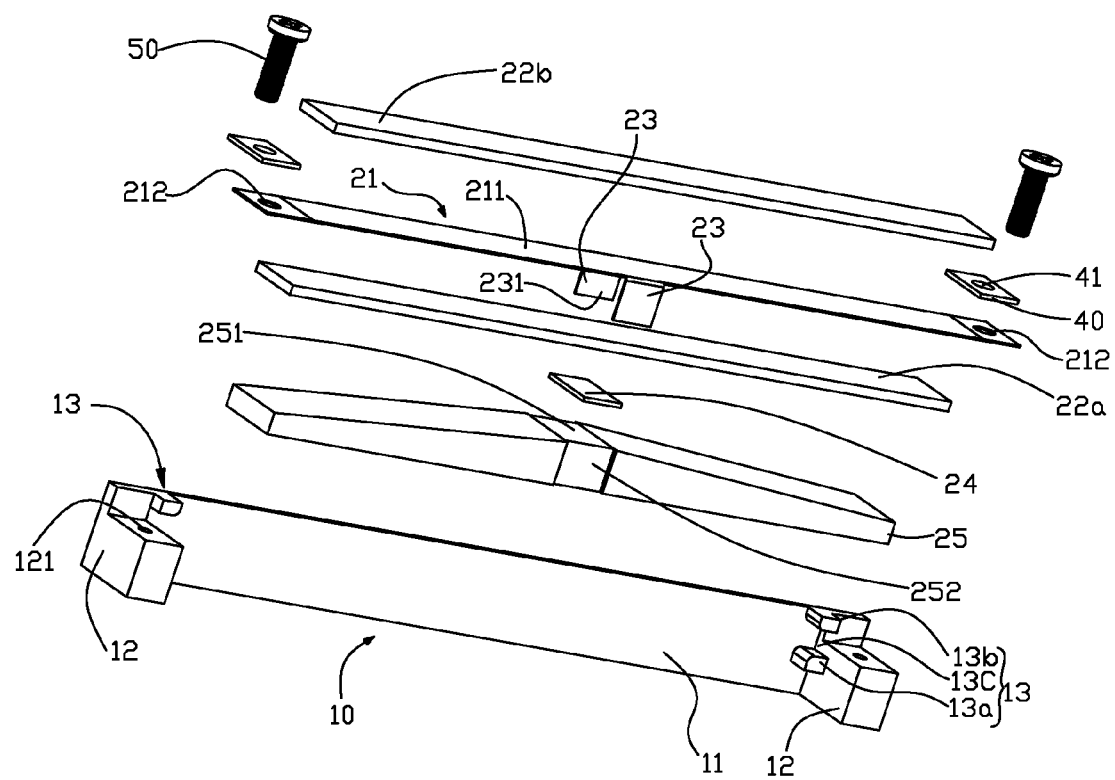
FIG. 3 is an exploded view of the apparatus in FIG. 1.

Referring to FIGS. 1-3, a haptic feedback apparatus 100 for providing haptic feedback includes a main board 10, and a vibration unit 20 mounted on a mounting surface 11 of the main board 10. The vibration unit 20 may be mounted on selected position of the main board 10 according to factual requirement. In the exemplary embodiment, the vibration unit 20 is mounted on a part adjacent to the edge of the main board 10. The vibration unit 20 is capable of vibrating along a direction Z-Z parallel to the mounting surface 11 of the main board 10 where the vibration unit 20 is mounted on. The main board 10 may be a component used in an electronic device, such as a mobile phone, a portable gaming device, etc. The main board 10 may also be a component used to assemble the haptic feedback apparatus 100. The main board 10 may be a displaying screen, or a printed circuit board, or a housing of the electronic device. In fact, the main board 10 may be a carrier for assembling the vibration unit 20 with the electronic device.

In the exemplary embodiment, the vibration unit 20 is mounted and fixed on the main board 10 by a pair of screws 50 cooperating with two ends of the vibration unit 20. In alternative embodiments, the vibration unit 20 can also be mounted on the main board 10 by adhesive or other connecting means. When the vibration unit 20 vibrates, the main board 10 transmits the tactile vibration to the electronic device for providing haptic feedback to the user who is operating the electronic device.

Referring to FIGS. 2-3, the main board 10 defines a pair of protrusions 12 extending from the mounting surface 11 thereof. Each of the protrusions 12 defines a board hole 121 with screw threads on inner sides of the board hole 121. The vibration unit 20 includes a substrate 21, a first piezoelectric layer 22a attached to a side of the substrate 21, a second piezoelectric layer 22b attached to another side of the substrate 21, and a mass 25 attached to one of the piezoelectric layers. Each of the substrate 21, the piezoelectric layers 22a, 22b, and the mass 25 is substantially perpendicular to the mounting surface 11 of the main board 10. Two piezoelectric layers 22a, 22b are used to enhance the vibration of the vibration unit 20. In fact, only one piezoelectric layer can also vibrate.

The substrate 21 comprises a main body 211, and a pair of wings 23 extending perpendicularly from the periphery of the main body 211, and accordingly, a first gap 231 is formed between the pair of wings. Two distal ends of the main body 211 defines a fastening hole 212 for partially aligning with the board hole 121, respectively. In addition, for firmly positioning the mass 25, the mass 25 defines a pair of notches 252. While assembled, the mass 25 is clasped by the wings 23 of the substrate 21 with the wings 23 cooperating with the notches 252. Furthermore, a pair of gaskets 40 is provided to cooperate with the screws for fixing two distal ends of the substrate 21 to the main board 10. Each of the gaskets 40 defines a threaded-hole 41 for at least partially aligning with the fastening holes 212.

For cushioning the mass 122 vibrating, the vibration unit 20 further comprises a cushion blocking 24 located between the mass 25 and the main body 211. The mass 25 defines a slightly concave 251 adjacent the notches 252. While assembled, the cushion blocking 24 is accommodated in the concave 251. The cushion blocking 24 serves as a sponge-robber pad.

The main board 10 further includes a pair of stop blocks 13 extending from the mounting surface 11 thereof. In the exemplary embodiment, each of stop blocks 13 defines a first block 13a, a second block 13b opposite to the first block 13a, and a second gap 13c formed between the first block 13a and the second block 13b.

While assembled, the first piezoelectric layer 22a and the second piezoelectric layer 22b are respectively attached to the sides of the substrate 120, and the mass 25 is attached to one of the two piezoelectric layers, for example, the first piezoelectric layer 22a. The mass 25 defines a side surface adjacent to the first piezoelectric layer 22a. Along a direction from a portion adjacent to the center of the mass 25 toward the distal end of the mass 25, a distance between the first piezoelectric layer 22a and the side surface of the mass 25 gradually increases, which provides the piezoelectric layer with more vibrating amplitude (refer to FIG. 2). Another word, the mass 25 connects to the first piezoelectric layer 22a with a middle portion of the side surface attached to the side of the first piezoelectric layer 22a. Two distal ends of the vibration unit 20 are located in the second gap 13c, i.e., between the first block 13a and the second block 13b. During vibration, the vibrating amplitude of the vibration unit 20 is restricted by the stop blocks 13. Another word, the stop block provides the vibration unit with a vibrating space smaller than the inherent amplitude of the vibration unit.

Accordingly, the vibration unit 20 is mounted on the main board 10 by the screws 50 pass through the threaded-hole 41, the fastening hole 212 of the substrate 21, and the board hole 121 of the protrusion 12 of the main board 10. The screws 50 fix the vibration unit 20 on the main board 10 along a direction parallel to the main board 10, which makes the assembling process much easier. Two distal ends of the vibration unit 20 are at least partially received in the second gap 13c, which restricts the vibration unit 20 and avoids excessive vibration amplitude of the vibration unit.

In the present disclosure, the vibration unit is mounted and fixed to the main board by screws along a direction substantially parallel to the main board which enables the operator to assemble the vibration unit to the main board mush easier. The protrusion defined on the main board keeps the vibration unit a distance from the main board for providing the vibration unit with sufficient space to vibrate. Further, a pair of stop block is provided to restricting the position of the first piezoelectric layer and the second piezoelectric layer. As the vibration amplitude of the vibration unit is restricted, high performance of the haptic feedback apparatus satisfy the requirements.

While the present invention has been described with reference to the specific embodiment, the description of the invention is illustrative and is not to be construed as limiting the invention. Various of modifications to the present invention can be made to the exemplary embodiment by those skilled in the art without departing from the true spirit and scope of the invention as defined by the appended claims.

What is claimed is:

1. A haptic feedback apparatus, comprising:
   a main board defining a mounting surface;
   a vibration unit mounted on the mounting surface of the main board, the vibration unit comprising at least a first piezoelectric layer and defining at least two protrusions at two distal ends thereof;
   at least a pair of stop block provided on two ends of the main board for restricting the vibrating amplitude of the vibration unit.

2. The haptic feedback apparatus as described in claim 1, wherein each of the stop blocks comprises a first block, a second block opposite to the first block, a part of the vibration unit is located between the first and second blocks, the vibrating unit being capable of vibrating along a direction parallel to the mounting surface.

3. The haptic feedback apparatus as described in claim 2, wherein the vibration unit further comprises a substrate defining a main body, the first piezoelectric layer attached to one side of the main body, and a mass attached to the first piezoelectric layer, each of the main body of the substrate, the piezoelectric layer, and the mass being substantially perpendicular to the mounting surface of the main board, the vibrating unit fixed to the main board through the protrusions along a direction parallel to the mounting surface by at least two screws.

4. The haptic feedback apparatus as described in claim 3 further comprising a second piezoelectric layer attached to another side of the main body of the substrate.

5. The haptic feedback apparatus as described in claim 3, wherein the substrate further comprises a wing extending perpendicularly from the main body, and the mass further defines a notch for at least partially receiving the wing.

6. The haptic feedback apparatus as described in claim 3, wherein the protrusions defines a board hole with screw threads on inner sides of the board hole, two distal ends of the substrate defines a fastening hole for partially aligning with the board hole for cooperating with the screw.

7. The haptic feedback apparatus as described in claim 5 further comprising at least a pair of gasket mounted on two distal ends of the substrate, respectively, the gasket defining a threaded-hole for cooperating with the screw.

8. The haptic feedback apparatus as described in claim 5, wherein the vibration unit further comprises a cushion blocking sandwiched between the mass and one of the piezoelectric layers, and the mass further defines a slightly concave corresponding to the cushion blocking.

9. The haptic feedback apparatus as described in claim 8, wherein the slightly concave locates on the center of the mass and adjacent to the notches.

10. The haptic feedback apparatus as described in claim 9, wherein the mass includes a side surface adjacent to the first piezoelectric layer, along a direction from a portion adjacent to the center of the mass toward the distal end of the mass, a distance between the first piezoelectric layer and the side surface is gradually increases.

* * * * *